United States Patent
Rasek et al.

(10) Patent No.: US 11,601,062 B2
(45) Date of Patent: Mar. 7, 2023

(54) POWER CONVERTER, ARRANGEMENT COMPRISING AN ELECTRIC MACHINE AND A POWER CONVERTER, AND VEHICLE

(71) Applicant: VALEO SIEMENS EAUTOMOTIVE GERMANY GMBH, Erlangen (DE)

(72) Inventors: Guido Rasek, Forchheim (DE); Markus Reymann, Nuremberg (DE)

(73) Assignee: VALEO SIEMENS EAUTOMOTIVE GRMANY GMBH, Erlangen (DE)

(*) Notice: Subject to any disclaimer, the term of this patent is extended or adjusted under 35 U.S.C. 154(b) by 157 days.

(21) Appl. No.: 16/912,782

(22) Filed: Jun. 26, 2020

(65) Prior Publication Data
US 2020/0412269 A1 Dec. 31, 2020

(30) Foreign Application Priority Data
Jun. 28, 2019 (DE) .................. 10 2019 117 594.1

(51) Int. Cl.
*H02M 7/00* (2006.01)
*H01F 27/36* (2006.01)
*B60L 15/00* (2006.01)
*H02B 1/20* (2006.01)
*H05K 7/14* (2006.01)

(52) U.S. Cl.
CPC ........... *H02M 7/003* (2013.01); *B60L 15/007* (2013.01); *H01F 27/36* (2013.01); *H02B 1/20* (2013.01); *H05K 7/1432* (2013.01); *H05K 2201/10272* (2013.01)

(58) Field of Classification Search
None
See application file for complete search history.

(56) References Cited

U.S. PATENT DOCUMENTS

| | | | | |
|---|---|---|---|---|
| 5,382,167 A | * | 1/1995 | Janson, Jr. ......... | H01R 13/6205 439/38 |
| 5,541,567 A | * | 7/1996 | Fogel .................... | H05K 3/445 336/200 |
| 9,634,428 B2 | * | 4/2017 | DiFonzo ............ | H01R 13/6205 |
| 2009/0002974 A1 | | 1/2009 | Yahata et al. | |
| 2011/0204845 A1 | * | 8/2011 | Paparo ................. | B60L 53/122 320/108 |
| 2014/0160823 A1 | | 6/2014 | Uetake et al. | |
| 2018/0263557 A1 | * | 9/2018 | Kahlman ............. | H04B 5/0012 |
| 2019/0100107 A1 | * | 4/2019 | Islinger ................... | H01F 38/14 |
| 2021/0379723 A1 | * | 12/2021 | Xu ........................ | B24B 37/013 |

* cited by examiner

*Primary Examiner* — Courtney L Smith
(74) *Attorney, Agent, or Firm* — Manabu Kanesaka

(57) ABSTRACT

A power converter, includes a housing and a busbar arrangement, which is arranged inside the housing, wherein the power converter is designed to guide an alternating current along the busbar arrangement, the power converter also includes at least one planar flux-conducting element made of a magnetically highly permeable material, which is arranged between a wall of the housing and the busbar arrangement.

16 Claims, 5 Drawing Sheets

Figure 1:
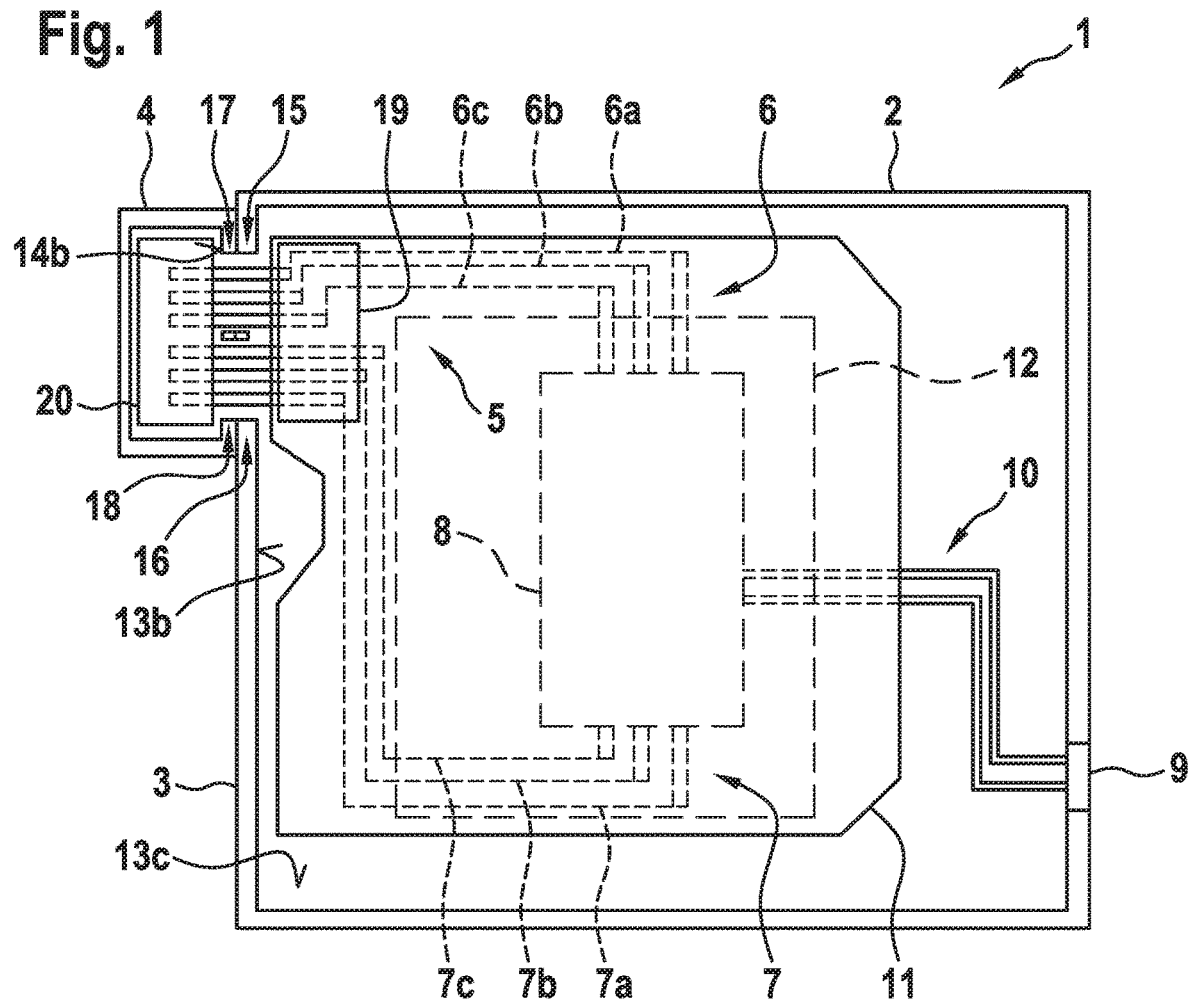

POWER CONVERTER, ARRANGEMENT COMPRISING AN ELECTRIC MACHINE AND A POWER CONVERTER, AND VEHICLE

RELATED APPLICATIONS

The present application is based on, and claims priority from, German Application No. DE 10 2019 117 594.1 filed Jun. 28, 2019, the disclosure of which is hereby incorporated by reference herein in its entirety.

The present invention relates to a power converter, comprising a housing and a busbar arrangement which is arranged inside the housing, wherein the power converter is designed to guide an alternating current along the busbar arrangement.

The invention additionally relates to an arrangement comprising an electric machine and a power converter, and to a vehicle.

In power converters, an input-side or output-side alternating current is often guided via a busbar arrangement. The busbar arrangement in this case may radiate magnetic alternating fields during operation, the magnetic flux densities of which outside a housing of the power converter must be limited to permissible values in accordance with guidelines on electromagnetic compatibility, stipulated for example by the ICNIRP (International Commission on Non-Ionizing Radiation Protection). As a result, humans in the surrounding environment of the power converter must be protected against non-ionising radiation. In particular in the case of use of the power converter in an electric vehicle, the power converter may be situated in the vicinity of vehicle occupants, and therefore specified limit values for protection of the vehicle occupants must be observed. The guidelines typically include stipulations for limiting the magnetic alternating fields for certain frequency ranges, among other things for a frequency range below 1 kHz.

Various approaches for limiting magnetic fields are known. Thus, the housing may be formed from a highly permeable material, which is costly, however, and results in a high weight of the power converter. An increase in the distance between the vehicle occupants and the power converter or the use of thick casings for the housing in order to generate significantly high eddy currents is often impossible due to installation space restrictions in the vehicle. It is also conceivable to optimise the shape of the busbar arrangement in respect of a reduction of the radiation of magnetic fields, however this limits the degrees of freedom for installation of the busbar arrangement in the housing. It is also known to form the housing from a sandwich material, for example from an aluminium layer and a ferromagnetic layer plated thereon, however this results, in turn, in high costs.

The object of the invention is consequently to describe a possibility for improving the electromagnetic compatibility in a power converter which may be produced economically in respect of costs and the weight of the power converter and which produces low electrical losses.

In order to solve this problem, in accordance with the invention a power converter of the kind described at the outset comprises at least one planar flux-conducting element made of a magnetically highly permeable material, which is arranged between a wall of the housing and the busbar arrangement.

The invention is based on the consideration of improving the electromagnetic compatibility of the power converter in respect of the radiation of magnetic alternating fields, in particular in a frequency range below 1 kHz, by introducing the at least one planar flux-conducting element between the wall of the housing and the busbar arrangement and thus providing a shielding, not over the entire housing, but merely at specific locations for regions of the housing that radiate said magnetic fields particularly strongly.

A planar flux-conducting element of this kind may advantageously be produced economically, results only in a small increase in weight, and may be tailored precisely to its installation location. This also makes it possible to add the flux-conducting element relatively late within the scope of a design process of the power converter and to adapt it flexibly to changes in standards or regional differences in respect of the stipulations for electromagnetic compatibility. The planar flux-conducting element also has the advantage that it brings about only small electrical losses, because hysteresis losses and eddy current losses in the flux-conducting element are dependent substantially on the magnetic flux density in the flux-conducting element and the volume of the flux-conducting element. The latter is advantageously small on account of the planar design.

The power converter is preferably configured as an inverter. The housing is generally formed from a low-permeable material, for example aluminium or aluminium alloy. In the context of this invention, the term "low-permeable" shall be understood in particular to mean a permeability number close to one, in particular between 0.9 and 1.1. In the context of this invention, the term "highly permeable" shall be understood in particular to mean a permeability number of at least 50, preferably at least 100, particularly preferably at least 1,000. The wall may form a ceiling or another inner side of the housing. Generally, it may be provided that the flux-conducting element or a flux-conducting element is arranged on the wall itself or in another component of the power converter between the wall and the busbar arrangement.

The flux-conducting element is advantageously formed from a ferromagnetic or ferrimagnetic material. The flux-conducting element may be formed from a soft iron material, as is used for example in transformer construction. The flux-conducting element generally has a thickness of at most 4 mm, preferably at most 2 mm, particularly preferably at most 1.2 mm, and/or at least 0.05 mm, preferably at least 0.1 mm, and particularly preferably at least 0.5 mm.

The busbar arrangement may comprise one busbar or a plurality of busbars. The busbars may form a plurality of busbar groups.

In the power converter according to the invention it may be provided that the flux-conducting element is formed from a metal plate. Metal plates of this kind are easily available and economical. Alternatively, it may be provided that the flux-conducting element is formed from a ferrite plate.

In an advantageous embodiment of the power converter according to the invention it is provided that the housing comprises a first housing element and a cover element formed from a magnetically low-permeable material, which cover element is arranged inside the first housing element; with a flux-conducting element being arranged on the cover element between the wall formed by the first housing element and the busbar arrangement. The local increase in permeability by the flux-conducting element is particularly expedient in the case of the low-permeable cover element, since typically only relatively small eddy currents are induced in the cover element, and therefore only a small shielding effect is provided for magnetic fields in the frequency range of interest. The cover element is preferably planar and/or is formed from aluminium.

The flux-conducting element may be secured on the cover element for example by adhesive bonding and/or welding and/or by a fastening element, such as a screw or a rivet. It is also possible that the flux-conducting element is incorporated into the cover element, for example by fusion and/or rolling and/or sintering and/or plating.

It may also be provided that the busbar arrangement is guided out from the first housing element through at least one opening in a second wall of the first housing element, which runs in particular perpendicularly to the first wall, and the flux-conducting element is arranged on an opening-side edge portion of the cover element. Such a region has been identified by way of measurement as being particularly critical in respect of the radiation of magnetic alternating fields through the first wall in the frequency range of interest, and therefore the mounting of the flux-conducting element in the opening-side edge portion contributes particularly significantly to improving the electromagnetic compatibility. It may also be that a plurality of openings are provided, with a separate busbar group of the busbar arrangement being guided through each opening.

In an advantageous refinement it is provided that the cover element comprises protrusions pointing towards at least one opening and the flux-conducting element extends over the protrusions. Due to the lengthening of the cover element by means of the protrusions as far as the vicinity of the second wall having the opening, the shielding effect may be far extended spatially. The shape of the flux-conducting element typically corresponds substantially to the shape of the protrusions. The flux-conducting element preferably does not extend over regions lying parallel to gaps between the protrusions.

In order to attain an additional shielding effect by eddy currents induced in the cover element, it is preferred if the cover element has a greater thickness in a portion on which the flux-conducting element is arranged than in other portions. The greater thickness may be provided by an elevation of the cover element on its side facing towards or away from the busbar arrangement.

It is also advantageous if the cover element has an indentation, in which the flux-conducting element is arranged. This facilitates the fastening of the flux-conducting element. The indentation preferably has a depth of at most 1.5 times, particularly preferably at most 1.1 times the thickness of the flux-conducting element arranged therein.

The first housing element typically houses a power electronics unit of the power converter, which power electronics unit is designed to receive the alternating current on the input side or provide the alternating current on the output side.

In the case of the power converter according to the invention, it is preferably also provided that the housing comprises a second housing element with at least one opening, through which the busbar arrangement is guided into the second housing element, with a flux-conducting element being arranged between the wall formed by the second housing element, which wall runs perpendicularly to a second wall having the at least one opening, and the busbar arrangement. It has been proven by way of measurement that the first wall of the second housing element is likewise a strongly radiating region of the power converter. Thus, an improvement of the electromagnetic compatibility may also be attained in these regions by the flux-conducting element. A plurality of openings may be provided, with a separate busbar group of the busbar arrangement being guided through each opening.

Generally, the previously described flux-conducting element arranged on the cover element may also be referred to as a first flux-conducting element, and the flux-conducting element arranged between the first wall of the second housing element and the busbar arrangement may also be referred to as the second flux-conducting element.

The flux-conducting element is preferably arranged on the first wall. To this end, the first wall expediently has a slot, into which the flux-conducting element is inserted. The flux-conducting element may be secured to the first wall, for example by adhesive bonding and/or welding and/or by a fastening element, such as a screw or a rivet. It is also possible that the flux-conducting element is incorporated into the first wall, for example by fusion and/or rolling and/or sintering and/or plating.

It is particularly preferably provided that the housing elements are arranged against one another in such a way that the busbar arrangement is guided through a particular opening from the first housing element into the second housing element. A boundary region between the housing elements that is particularly affected by the radiation of the magnetic alternating fields may thus be improved effectively in respect of its electromagnetic compatibility by means of the flux-conducting elements. Typically, the second wall of the first housing element and the second wall of the second housing element, that is to say the walls each having the opening, are formed in a number of pieces and/or are secured to one another by a fastening element. In accordance with a particularly preferred embodiment, a portion of the second housing element delimiting the at least one opening in the second housing element protrudes into the at least one opening in the first housing element.

It is provided in a specific embodiment of the power converter that the flux-conducting element is formed by a one-piece flux-conducting device passing through the openings. The flux-conducting device is typically completely planar. All embodiments for creating an individual flux-conducting element may be transferred to the flux-conducting device.

The second housing element typically houses a connection device for connection of the busbar arrangement to an electric machine. In this regard, the second housing element may also be interpreted as or referred to as a terminal box, connection box or junction box.

The object forming the basis of the invention is also achieved by an arrangement comprising an electric machine and a power converter according to the invention, wherein the power converter is designed to provide the alternating current for generating a rotary field of the electric machine.

The object forming the basis of the invention is also achieved by a vehicle, comprising an arrangement according to the invention, wherein the electric machine is designed to drive the vehicle.

Figure 2:
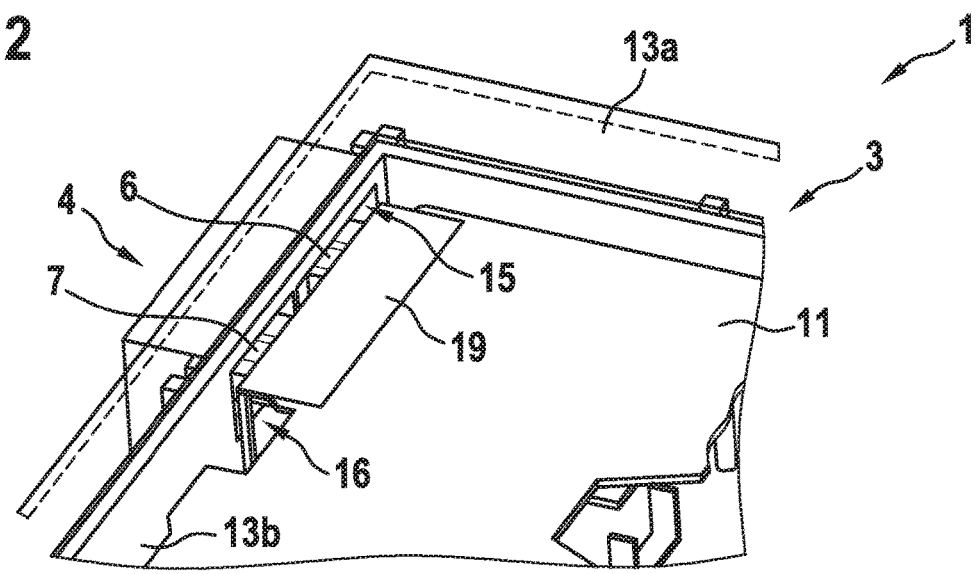
Figure 3:
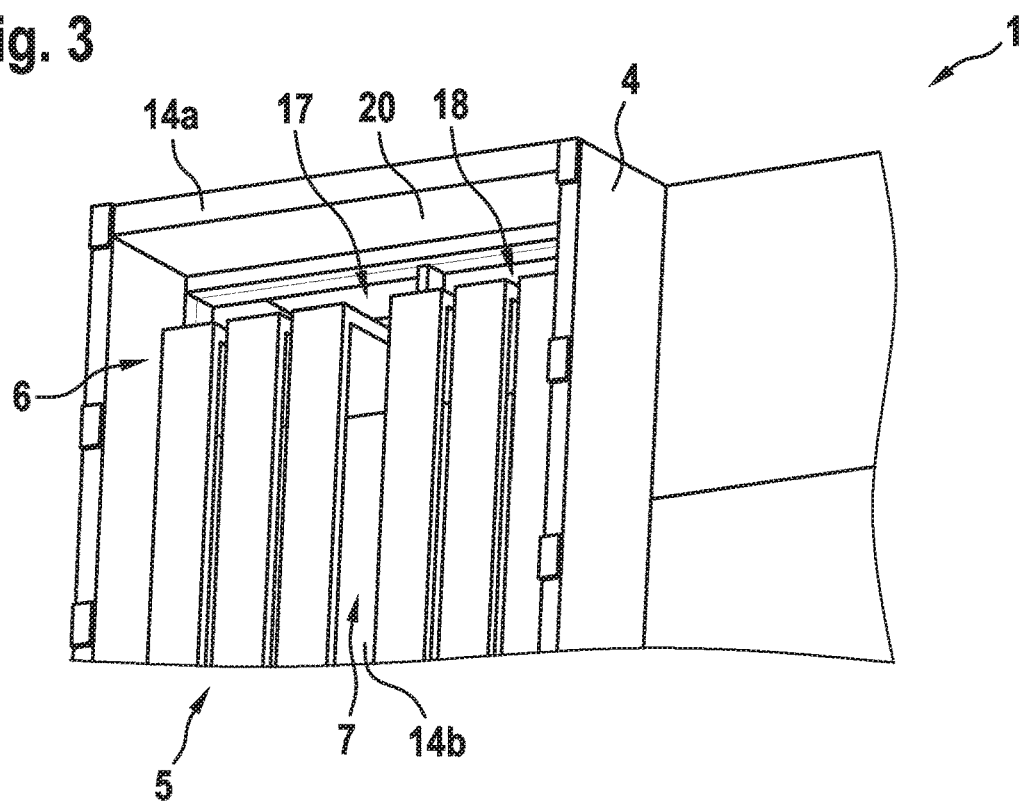
Figure 4:
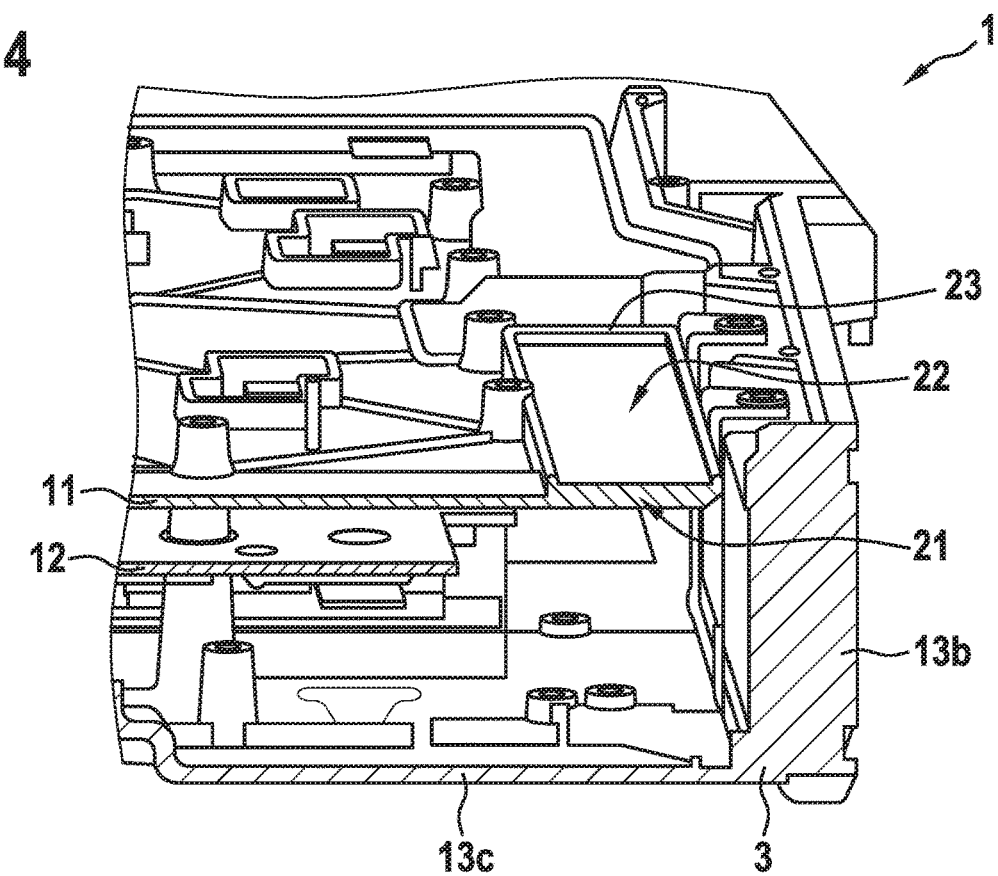
Figure 5:
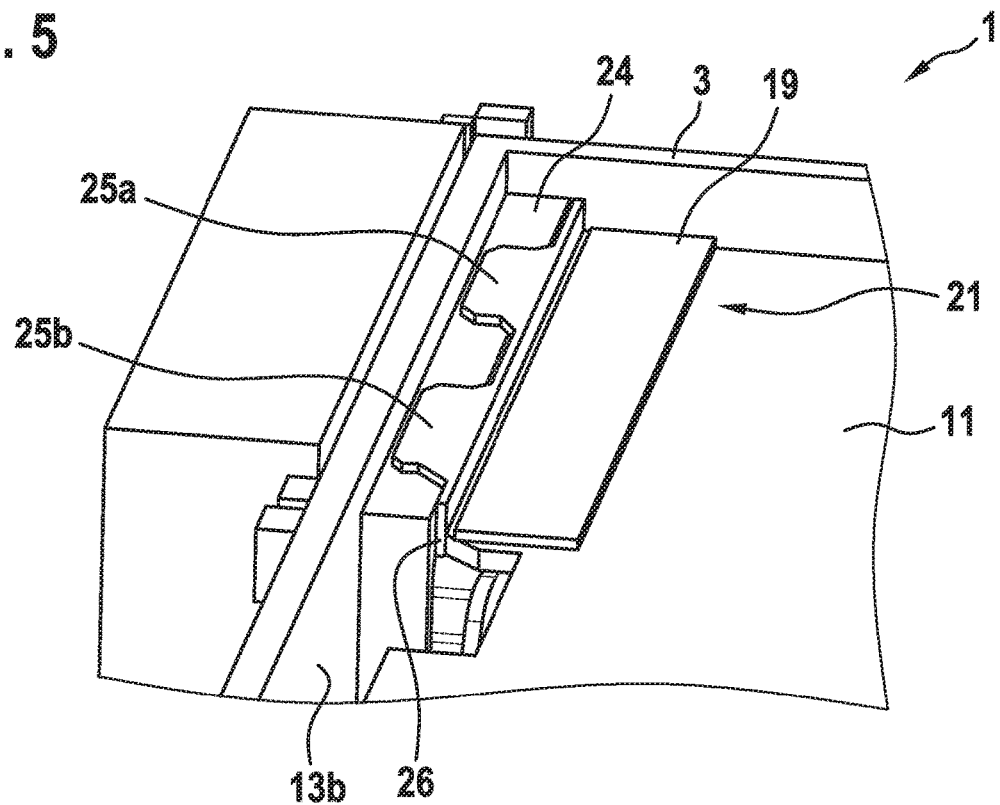
Figure 6:
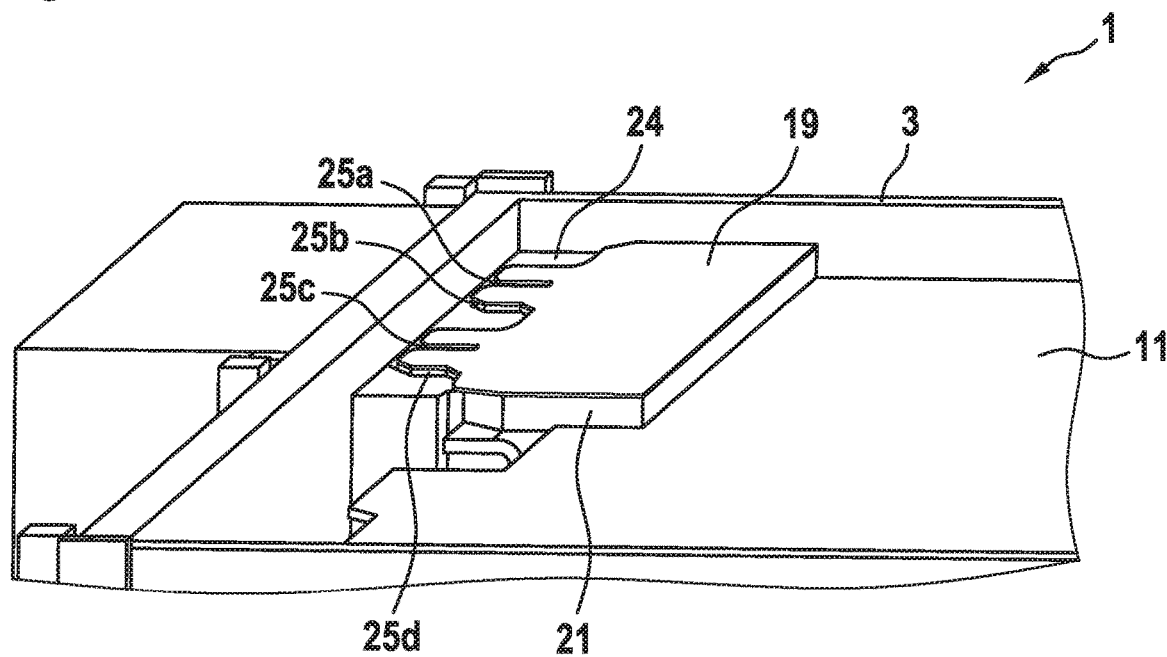
Figure 7:
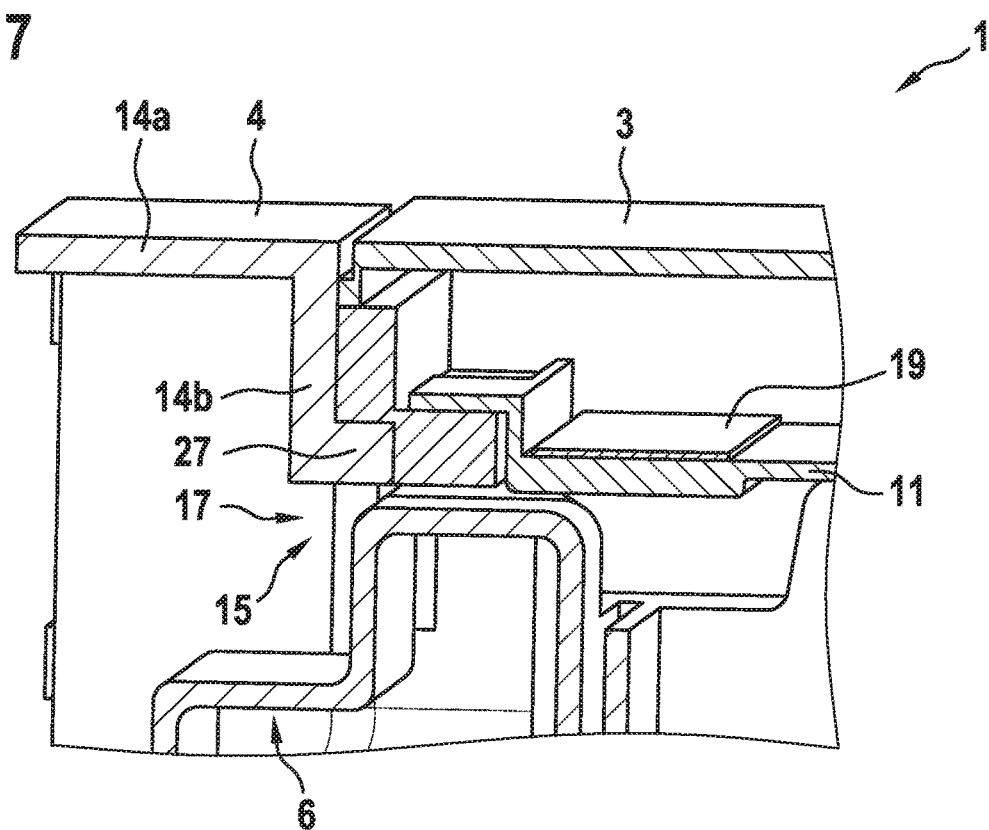
Figure 8:
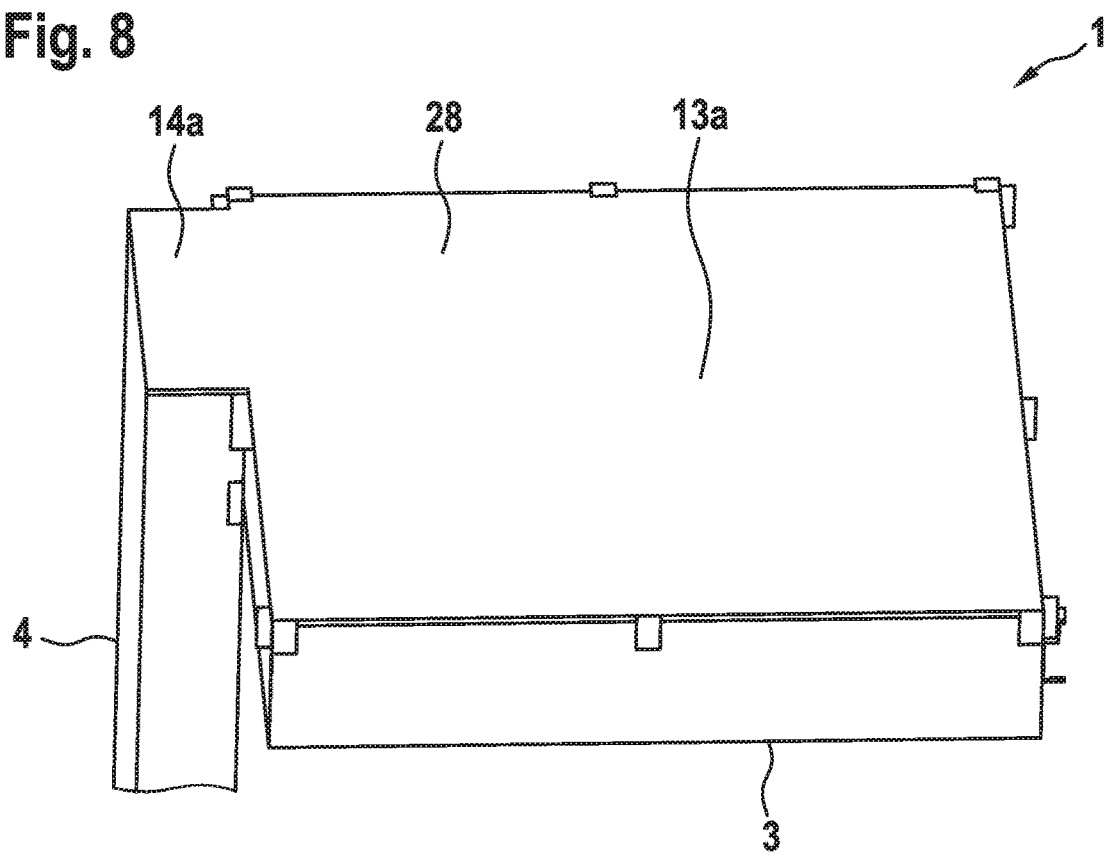
Figure 9:
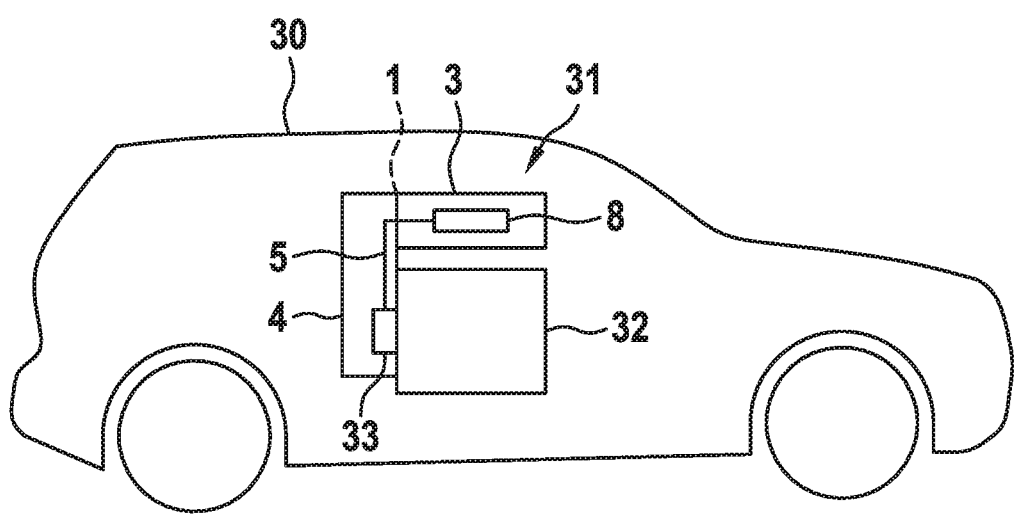

Further advantages and details of the present invention will become clear from the exemplary embodiments described hereinafter, with reference to the drawings. These are schematic illustrations and show:

FIG. 1 a basic illustration of a first exemplary embodiment of the power converter according to the invention;

FIG. 2 a perspective basic illustration of the first exemplary embodiment;

FIG. 3 a perspective basic illustration in the region of a second housing element of the first exemplary embodiment;

FIG. 4 a cut-away detailed illustration of a second exemplary embodiment in the region of a first housing element;

FIG. 5 a perspective basic illustration of a third exemplary embodiment of the power converter according to the invention;

FIG. 6 a perspective basic illustration of a fourth exemplary embodiment of the power converter according to the invention;

FIG. 7 a cut-away basic illustration of a fifth exemplary embodiment of the power converter according to the invention;

FIG. 8 a perspective basic illustration of a sixth exemplary embodiment of the power converter according to the invention; and FIG. 9 a perspective basic illustration of an exemplary embodiment of a vehicle according to the invention comprising an arrangement according to the invention.

FIG. 1 shows a basic illustration of a first exemplary embodiment of a power converter 1.

The power converter 1 comprises a housing 2, which has a first housing element 3 and a second housing element 4. The housing 2 is formed from a low-permeable material, in the present case aluminium or aluminium alloy, in order to reduce the weight of the power converter 1. The power converter 1 furthermore comprises a busbar arrangement 5, which comprises two busbar groups 6, 7, each having three busbars 6a, 6b, 6c, and 7a, 7b, 7c. The busbar arrangement 5 is connected on the output side to a power electronics unit 8 of the power converter 1 configured as an inverter, with each busbar group 6, 7 guiding a three-phase alternating current. In addition, the power converter 1 comprises a direct voltage connection 9, which is connected via further busbars 10 to an input of the power electronics unit 8.

The power electronics unit 8, the direct voltage connection 9, and the busbars 10 are fully housed in the first housing element 3, which additionally houses a cover element 11 and a printed circuit board 12, which is arranged between the power electronics unit 8 and the cover element 11 and comprises a control electronics unit for the power electronics unit 8. The second housing element 4 by contrast forms a connection box or a junction box for connection of an electric machine to the power converter 1, for which purpose the second housing element 4 houses a connection device 33 (see FIG. 9).

The first housing element 3 has a first wall 13a (see FIG. 2), which forms a ceiling of the first housing element 3, a second wall 13b formed as a side wall, further side walls, and a third wall 13c forming a base. The side walls extend perpendicularly from the third wall 13c and thus form a receiving volume closed off by the first wall 13a. The second housing element 4 has a first wall 14a (see FIG. 4), a second wall 14b formed as a side wall, further side walls, and a third wall (not shown) opposite the first wall 14a.

The busbar arrangement 5 extends from the power electronics unit 8, through two openings 15, 16 arranged in the second wall 13b of the first housing element 2 and through two openings 17, 18 formed in the second wall 14b of the second housing element 4, into the second housing element 4. The first busbar group 6 extends consequently through the openings 15, 17, and the second busbar group 7 through the openings 16, 18. Inside the second housing element 4, the busbar arrangement 5 extends into the drawing plane of FIG. 1.

Inside the first housing element 3, the busbar arrangement 5 extends largely between the third wall 13c and the cover element 11. A first flux-conducting element 19 is arranged on the cover element between the busbar arrangement 5 and the first wall 13a. The first flux-conducting element is situated on an opening-side edge portion of the cover element 11. A second flux-conducting element 20 is arranged on the first wall 14a of the second housing element 4, between said wall and the busbar arrangement 5. The flux-conducting elements 19, 20 are each planar with a thickness of 1 mm and are formed from a highly permeable metal sheet made of a soft iron material and are used to shield magnetic alternating fields in a frequency range up to 1 kHz in order to improve the electromagnetic compatibility of the power converter 1.

FIG. 2 is a perspective basic illustration of the power converter 1 and shows the arrangement of the first flux-conducting element 19 on the cover element 11 and the first wall 13a of the first housing element 3 in a position not connected to the side walls. The first flux-conducting element 19 rests against the substantially flat cover element 11.

FIG. 3 is a perspective basic illustration of the power converter 1 in the region of the second housing element 4.

The angled profile of the busbar arrangement 5 once it has passed through the openings 17, 18 can be seen. The second flux-conducting element 20 is arranged on the first wall 14a by being placed in a slot formed therein and is adhesively bonded or welded to said first wall.

Further exemplary embodiments of the power converter 1 will be described hereinafter, wherein like or functionally like components are provided with identical reference signs, Unless otherwise described, the further exemplary embodiments correspond to the first exemplary embodiment.

FIG. 4 is a cut-away detailed illustration of a second exemplary embodiment of a power converter 1 in the region of the first housing element 3 without the busbar arrangement 5 and without the flux-conducting element 19.

The cover element 11, in a portion 21 on which the first flux-conducting element 19 is arranged, has a greater thickness than in its other portions. Sufficiently large eddy currents may thus be generated in the cover element 11 in order to further increase the shielding effect.

An indentation 22 is additionally formed in the portion 21 on the side of the cover element facing away from the busbar arrangement 5, with the flux-conducting element 19 being arranged in said indentation. The indentation, similarly to the flux-conducting element 19, is 1 mm deep, such that an edge 23 of the indentation terminates flush with the flux-conducting element 19.

FIG. 5 is a perspective basic illustration of a third exemplary embodiment of the power converter 1. In the third exemplary embodiment the first housing element 3, on its second wall 13b, has a frame-like protrusion 24 surrounding the openings 15, 16. The cover element 11 has protrusions 25a, 25b, which point towards the openings 15, 16 and which rest against the protrusion 24 and are connected via an offset 26 to the portion 21 on which the first flux-conducting element is arranged. The portion 21, however, is not thickened in the second example embodiment.

FIG. 6 is a perspective basic illustration of a fourth exemplary embodiment of the power converter 1. In the fourth exemplary embodiment the first housing element 3 likewise comprises the protrusion 24. The cover element 11 has four protrusions 25a to 25d, which protrude towards the openings 15, 16 from the thickened portion 21 and rest against the protrusion 24. The first flux-conducting element 19 extends in this case also over the protrusions 25a to 25d.

FIG. 7 is a cut-away basic illustration of a fifth exemplary embodiment of the power converter 1. In the fifth exemplary embodiment collar-like portions 27 of the second housing element 4, which collar-like portions delimit an opening 17, 18 each, protrude into the openings 15, 16 in the first housing element 3.

FIG. 8 is a perspective basic illustration of a sixth exemplary embodiment of the power converter 1, in which the first wall 13a of the first housing element 3 and the first wall 14a of the second housing element 4 are formed by a one-piece ceiling element 28.

In accordance with a seventh exemplary embodiment (not shown), the flux-conducting elements 19, 20 are formed by a one-piece flux-conducting device passing through the openings 15 to 18.

The aforementioned exemplary embodiments are generally combinable. In accordance with further exemplary embodiments, a or each flux-conducting element 19, 20 may be formed from a ferrite plate. In further exemplary embodiments it is provided that a or each flux-conducting element 19, 20 is incorporated into the cover element 11 or into the first wall 14a of the second housing element 4, for example is secured by a fusing, rolling, sintering or plating process, or by means of fastening elements, such as screws or rivets.

FIG. 9 is a basic illustration of an exemplary embodiment of a vehicle 30 with an exemplary embodiment of an arrangement 31. This comprises an electric machine 32, which is designed to drive the vehicle 30, and a power converter 1 according to one of the previously described exemplary embodiments. The power converter 1 is designed to provide the alternating current for generating a rotary field of the electric machine 32. The connection device 33 arranged in the second housing element 4 is also shown, by means of which connection device the electric machine 32 is connected via the busbar arrangement 5 to the power electronics unit 8 of the power converter 1.

The invention claimed is:

1. A power converter, comprising:
a housing comprising a first housing element and a cover element formed from a magnetically low-permeable material, the first housing element forming a first wall, and the cover element being arranged inside the first housing element,
a busbar arrangement, which is arranged inside the housing, and
a planar flux-conducting element made of a magnetically highly permeable material, the flux-conduction element being arranged on the cover element between the first wall and the busbar arrangement,
wherein the power converter is designed to guide an alternating current along the busbar arrangement.

2. The power converter according to claim 1, wherein the flux-conducting element is formed from a metal plate or a ferrite plate.

3. The power converter according to claim 1, wherein the busbar arrangement is guided out from the first housing element through at least one opening in a second wall of the first housing element, and the flux-conducting element is arranged on an opening-side edge portion of the cover element.

4. The power converter according to claim 3, wherein the cover element has protrusions pointing towards the at least one opening and the flux-conducting element extends over the protrusions.

5. The power converter according to claim 1, wherein the cover element has a greater thickness in a portion on which the flux-conducting element is arranged than in other portions.

6. The power converter according to claim 1, wherein the cover element has an indentation, in which the flux-conducting element is arranged.

7. The power converter according to claim 1, wherein the first housing element houses a power electronics unit of the power converter, which power electronics unit is designed to receive the alternating current on the input side or provide the alternating current on the output side.

8. A power converter comprising:
a housing comprising a second housing element with at least one opening, the second housing element forming a first wall and a second wall, the first wall running perpendicularly to the second wall, and the second wall comprising at least one opening, a busbar arrangement, which is arranged inside the housing and guided into the second housing element, and a planar flux-conducting element made of a magnetically highly permeable material, which is arranged between the first wall and the busbar arrangement, wherein the power converter is designed to guide an alternating current along the busbar arrangement.

9. The power converter according to claim 8, wherein the flux-conducing element is arranged on the first wall.

10. The power converter according to claim 8, wherein the housing further comprises a first housing element and a cover element formed from a magnetically low-permeable material, the first housing element forming a first wall and a second wall with at least one opening, the cover element being arranged inside the first housing element, and the busbar arrangement being guided out from the first housing element through the at least one opening in the second wall of the first housing element,
the power converter comprising a further flux-conducting element arranged on an opening-side edge portion of the cover element between the first wall of the first housing element and the busbar arrangement, and
the housing elements are arranged against one another in such a way that the busbar arrangement is guided through the openings from the first housing element into the second housing element.

11. The power converter according to claim 10, wherein the flux-conducting elements are formed by a one-piece flux-conducting device passing through the openings.

12. The power converter according to claim 8, wherein the second housing element houses a connection device for connection of the busbar arrangement to an electric machine.

13. An arrangement comprising an electric machine and the power converter according to claim 1, wherein the power converter is designed to provide the alternating current for generation of a rotary field of the electric machine.

14. A vehicle, comprising the arrangement according to claim 13, wherein the electric machine is designed to drive the vehicle.

15. An arrangement comprising an electric machine and the power converter according to claim 8, wherein the power converter is designed to provide the alternating current for generation of a rotary field of the electric machine.

16. A vehicle, comprising the arrangement according to claim 15, wherein the electric machine is designed to drive the vehicle.

* * * * *